(12) United States Patent
Shoji et al.

(10) Patent No.: US 8,125,062 B2
(45) Date of Patent: Feb. 28, 2012

(54) LEAD FRAME, LEAD FRAME FABRICATION, AND SEMICONDUCTOR DEVICE

(75) Inventors: Masanobu Shoji, Tsuruoka (JP); Toru Fujita, Tsuruoka (JP)

(73) Assignee: Seiko Epson Corporation, Tokyo (JP)

( * ) Notice: Subject to any disclaimer, the term of this patent is extended or adjusted under 35 U.S.C. 154(b) by 74 days.

(21) Appl. No.: 12/723,894

(22) Filed: Mar. 15, 2010

(65) Prior Publication Data

US 2010/0301465 A1 Dec. 2, 2010

(30) Foreign Application Priority Data

Jun. 1, 2009 (JP) ................................. 2009-131961

(51) Int. Cl.
*H01L 23/495* (2006.01)

(52) U.S. Cl. ................ 257/666; 257/676; 257/E23.031; 438/123

(58) Field of Classification Search .................. 257/666, 257/676, E23.031; 438/123; 361/813; 29/827
See application file for complete search history.

(56) References Cited

U.S. PATENT DOCUMENTS

| | | | |
|---|---|---|---|
| 5,847,458 A | 12/1998 | Nakamura et al. | |
| 6,528,879 B2 | 3/2003 | Sakamoto et al. | |
| 6,562,660 B1 * | 5/2003 | Sakamoto et al. | 438/124 |
| 6,700,905 B1 | 3/2004 | Karasawa et al. | |
| 6,946,324 B1 * | 9/2005 | McLellan et al. | 438/111 |
| 7,049,177 B1 * | 5/2006 | Fan et al. | 438/123 |
| 7,173,336 B2 | 2/2007 | Sakamoto et al. | |
| 7,276,793 B2 | 10/2007 | Sakamoto et al. | |
| 2005/0202274 A1 | 9/2005 | Elschner et al. | |
| 2009/0032943 A1 | 2/2009 | Shoji et al. | |
| 2009/0034225 A1 | 2/2009 | Shoji et al. | |
| 2009/0243095 A1 | 10/2009 | Fujita et al. | |
| 2009/0302466 A1 | 12/2009 | Shoji et al. | |

FOREIGN PATENT DOCUMENTS

| | | |
|---|---|---|
| JP | A-05-166985 | 7/1993 |
| JP | A-09-312355 | 12/1997 |
| JP | B2-3060020 | 4/2000 |
| JP | A-2001-024135 | 1/2001 |
| JP | A-2002-093847 | 3/2002 |
| JP | A-2002-280480 | 9/2002 |
| JP | B2-3609737 | 10/2004 |
| JP | B2-3780122 | 3/2006 |
| JP | A-2007-048981 | 2/2007 |
| JP | A-2007-281510 | 10/2007 |
| JP | B2-4032063 | 10/2007 |
| JP | A-2007-335464 | 12/2007 |
| JP | A-2009-055014 | 3/2009 |
| JP | A-2009-055015 | 3/2009 |
| JP | A-2009-246115 | 10/2009 |
| JP | A-2009-283746 | 12/2009 |
| JP | A-2009-302095 | 12/2009 |

* cited by examiner

*Primary Examiner* — Roy Potter
(74) *Attorney, Agent, or Firm* — Oliff & Berridge, PLC

(57) ABSTRACT

Lead frames and their fabricating method which reduce generation of defects in the process of fabricating semiconductor devices, in particular connection defects in wire bonding, thereby improving the product yield and reliability, and semiconductor devices using the lead frames and their fabricating method are provided. A method for fabricating a lead frame is characterized in including a process of forming a substrate equipped with a convex portion, and a metal layer having a first portion that overlaps a first surface included in the convex portion and a second portion that extends from the first portion and does not overlap the first surface, and a process of bending the metal layer such that the second portion of the metal layer overlaps a second surface included in the convex portion that intersects the first surface.

7 Claims, 16 Drawing Sheets

LEAD FRAME, LEAD FRAME FABRICATION, AND SEMICONDUCTOR DEVICE

The present application claims priority based on Japanese Patent Application 2009-131961 filed Jun. 1, 2009, and the application is herein incorporated in the present specification.

TECHNICAL FIELD

The present invention relates to lead frames, semiconductor devices and their fabricating methods and, in particular, to plating specifications for lead frames.

TECHNOLOGICAL BACKGROUND

Circuit devices that are used for electronic apparatuses are conventionally implemented in portable telephones, portable computers and the like, such that smaller, thinner and lighter implementations thereof have been pursued. A fabricating method for such circuit devices (i.e., a packaged semiconductor device 1), has already been described as prior art, as shown in FIGS. 23 (a)-(e) (see, for example, Patent Document 1).

The abovementioned fabricating process is described in greater detail. In FIG. 23 (a), initially, patterned metal layers 202 (hereafter also referred to as plated layers 202) are formed on a metal substrate 201 (hereafter also referred to as a lead frame 201). Next, as shown in FIG. 23 (b), etching is conducted using the metal layers 202 as a mask. In this etching, retaining sections 203 are provided in the metal substrate 201 at an intermediate portion thereof in its thickness direction. Then, as shown in FIG. 23 (c), an electronic component such as an IC (Integrated Circuit) element 204 or the like is mounted on the metal substrate 201 through the metal layer 202, and the IC element 204 is electrically connected (in other words, wire-bonded) to adjacent ones of the metal layers 202 with gold wires 205 or the like.

Thereafter, as shown in FIG. 23 (d), the IC element 204 and the gold wires 205 are sealed with an insulation (for example, with resin 206). Then, as shown in FIG. 23 (e), the retaining sections 203 are etched and removed, thereby exposing the resin 206. Finally, the lead frames 201 are diced into individual pieces, whereby packaged semiconductor devices 1 are fabricated.

Also, other prior art technology is described in, for example, Patent Document 2 to Patent Document 4.

PRIOR ART TECHNOLOGY DOCUMENT

Patent Document

[Patent Document 1] U.S. Pat. No. 3,060,020
[Patent Document 2] U.S. Pat. No. 3,609,732
[Patent Document 3] U.S. Pat. No. 3,780,122
[Patent Document 4] U.S. Pat. No. 4,032,063

SUMMARY OF THE INVENTION

Problems to be Solved by the Invention

By the way, when the plated layers 202 included in the lead frame 201 are formed by patterning, "wet etching using the plated layers 202 as a mask" or "wet etching using the resist film as a mask" may be utilized.

Problems in the two types of wet etching described above are described below.

FIG. 24 (a)-(d) illustrate one example of the problems when wet etching is conducted using the plated layers 202 as a mask. As shown in the figures, in the case of wet etching using the plated layers 202 as a mask, there are possibilities in that configuration defects such as bends and deformations of the plated layers 202, and reduced rigidity of the plated layers 202 at their outer peripheral portions 202a would become problems. These problems are concretely described below with reference to the drawings.

It is noted that FIGS. 24 (a) and (b) show cross-sectional views in etching steps in the conventional technology (namely, steps corresponding to FIGS. 23 (a) and (b)), and FIGS. 24 (c) and (d) in wire bonding steps in the conventional technology (namely, steps corresponding to FIG. 23 (c)). Here, an IC element 204 is mounted on a convex portion 201a through the plated layer 202, as shown in FIGS. 24 (c) and (d). Moreover, the IC element 204 is electrically connected to the adjacent plated layer 202 through a gold wire 205.

As shown in FIGS. 24 (a) and (b), when wet etching is conducted with the plated layers 202 as a mask, portions of the metal substrate immediately below the outer peripheral portions 202a of the plated layers 202 may be carved due to side etching, whereby the convex portions 201a may be formed. This is because wet etching is generally an isotropic etching method. For this reason, as shown in FIG. 24 (b), the outer peripheral portions 202a of the plated layers 202 may form configurations protruded from the convex portions 201a. With this configuration, spaces 201b (gaps) are present immediately below the outer peripheral portions 202a, such that the outer peripheral portions 202a may not be able to retain sufficient mechanical strength.

In this state, as shown in FIG. 24 (c), when wire bonding is applied to the outer peripheral portion 202a, a portion of the outer peripheral portion 202a may be mechanically destroyed due to the insufficient strength, and wire connection failure may possibly occur.

FIG. 25 (a)-(e) illustrate one example of the problems when wet etching is conducted using resist films 207 as a mask. The wet etching that uses the resist films 207 as a mask entails a problem of technical difficulty in covering the entire areas of a first surface 208 and a second surface 209 included in the convex portions 201a with plated layers 202. More specifically, according to the conventional technology, there may be portions on the convex portion 201a included in the lead frame 201 where the plated layers 202 are not formed. These problems will be concretely described with reference to the drawings.

It is noted that FIGS. 25 (a)-(c) show cross-sectional views in etching steps in the conventional technology, and FIGS. 25 (d) and (e) show cross-sectional views in wire bonding steps in the conventional technology. Here, similar to FIGS. 24 (c) and (d), an IC element 204 is mounted on a convex portion 201a included in the lead frame 201 through the plated layer 202 (see FIGS. 25 (d) and (e)).

As shown in FIG. 25 (a), when wet etching is conducted using the resist layers 207 as a mask, portions other than those covered by the resist layers 207 are etched, as shown in FIG. 25 (b). Next, the resist films 207 are removed, and other resist films (not shown) are coated on the etched portions. Thereafter, plated layers 202 are formed on the convex portion 201a. In this instance, as shown in FIG. 25 (c), "deviations d" may occur between end sections of the convex portion 201a and end sections of the plated layer 202. This is because "mask positional deviations" occur at the time of the "mask alignment step" when fabricating a semiconductor device.

As shown in FIG. 25 (d), when the plated layers 202 are formed on the convex portion 201a in a state including the "deviations d," there may be occasions where the IC element 204 and the convex portion 201a are wire-bonded without being intervened by the plated layer 202 (see FIG. 25 (e)). There is a possibility that this may cause wire connection failures.

Therefore, the present invention has been made in view of the aforementioned situations, and its object is to provide lead frames and their fabricating method which reduce generation of defects in the process of fabricating semiconductor devices, in particular connection defects of wire bonding, thereby improving the product yield and reliability, and to provide semiconductor devices using the lead frames and their fabricating method.

Means for Solving the Problems

To achieve the object described above, a method for fabricating a lead frame in accordance with an embodiment of the invention is characterized in comprising a forming a substrate equipped with a convex portion, and a metal layer having a first portion that overlaps a first surface of the convex portion and a second portion that extends from the first portion and does not overlap the first surface, and bending the metal layer such that the second portion of the metal layer overlaps a second surface of the convex portion that traverses the first surface.

Also, in the method for fabricating a lead frame described above, the forming of the substrate may be characterized in that the metal layer is formed on a surface of a metal substrate, and the convex portion is formed by wet etching the metal substrate using the metal layer as a mask.

According to the method for fabricating a lead frame described above, the metal substrate is wet-etched, using the metal layer as a mask, whereby the metal layer having a portion protruding from the first surface of the formed convex portion can be formed. Moreover, according to the method for fabricating a lead frame described above, among the metal layer thus formed, the portion that protrudes from the first surface included in the convex portion is bent, such that, when wire bonding is applied in a method for fabricating a semiconductor device to be described below, the risk of a portion of the metal layer being mechanically destroyed can be reduced. Accordingly, lead frames that can improve the product yield and reliability can be stably provided.

Furthermore, in the method for fabricating a lead frame described above, the forming of the substrate may be characterized in: coating a first resist film on a surface of a metal substrate; wet-etching the metal substrate with the first resist film used as a mask; removing the first resist film after the wet etching; coating a second resist film in a concave section formed by the etching after the removing of the first resist film; forming the metal layer on the metal substrate exposed through the second resist film after the coating of the second resist film; and removing the second resist film after the forming of the metal layer.

Moreover, the method for fabricating a lead frame may be characterized in that the forming of the substrate may include forming the substrate to have a plurality of the convex portions, and the plurality of the convex portions may have the same shape and the same size.

According to the method for fabricating a lead frame described above, the metal substrate is wet-etched with the resist film as a mask, and the metal layer is formed thereafter, such that the metal layer having a portion protruding from the first surface included in the convex portion can be formed. Furthermore, according to the method for fabricating a lead frame described above, among the metal layer formed, the portion protruding from the first surface included in the convex portion is bent, such that, when wire-bonding is applied in a process of fabricating a semiconductor device to be described below, the risk of a portion of the metal layer being mechanically destroyed can be reduced. Accordingly, lead frames that can increase the product yield and reliability can be stably provided.

Also, a method for fabricating a semiconductor device in accordance with another embodiment of the invention is characterized in comprising forming a substrate equipped with a convex portion, and a metal layer having a first portion that overlaps a first surface of the convex portion and a second portion that extends from the first portion and does not overlap the first surface; a bending the metal layer such that the second portion of the metal layer overlaps a second surface of the convex portion that traverses the first surface; a fixing an IC element having an electrode to the substrate; a connecting the metal layer and the electrode with a conductive member; and a sealing the IC element and the conductive member with resin.

According to the method for fabricating a semiconductor device described above, the method for fabricating a lead frame described above is applied, such that the risk of a portion of the metal layer being mechanically destroyed can be reduced at the time of applying wire-bonding. Accordingly, semiconductor devices that can increase the product yield and reliability can be provided, and the products can be provided at low cost.

Also, a lead frame in accordance with another embodiment of the invention is characterized in including a substrate equipped with a convex portion, and a metal layer having a first portion that overlaps a first surface of the convex portion and a second portion that extends from the first portion and does not overlap the first surface, wherein the metal layer is bent such that the second portion of the metal layer overlaps a second surface of the convex portion that traverses the first surface included in the convex portion.

Further, the lead frame described above may be characterized in that an angle of intersection between the first surface and the second surface is an acute angle.

According to the lead frame, the metal layer formed on the first surface included in the convex portion does not include a protruded portion, such that, when wire-bonding is applied in a method for fabricating a semiconductor device to be described below, the risk of a portion of the metal layer being mechanically destroyed can be reduced. Accordingly, semiconductor devices with improved yield and reliability can be provided.

Also, a semiconductor device in accordance with another embodiment of the invention is characterized in including: a substrate equipped with a convex portion, and a metal layer having a first portion that overlaps a first surface of the convex portion and a second portion that extends from the first portion and does not overlap the first surface; an IC element fixed to the substrate and having an electrode; a conductive member that connects the metal layer to the electrode of the IC element; and a resin that seals the IC element and the conductive member.

According to the semiconductor device described above, the lead frame described above can be applied, such that, when wire-bonding is used in a process of fabricating a semiconductor device to be described below, it is possible to reduce the risk of mechanical destruction of a portion of the metal layer formed on the first surface included in the convex portion. Accordingly, semiconductor devices with improved yield and reliability can be provided, and the products can be provided at low costs.

EMBODIMENTS OF THE INVENTION

Hereinbelow, embodiments of the invention will be described with reference to the accompanying drawings.

(1) First Embodiment

Figure 1A:
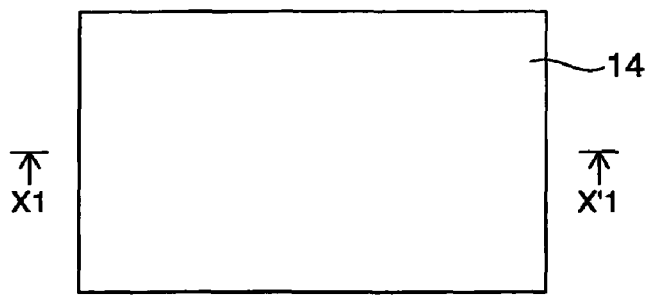
FIGS. 1A and 1B show a method for fabricating a lead frame in accordance with an embodiment.
Figure 1B:
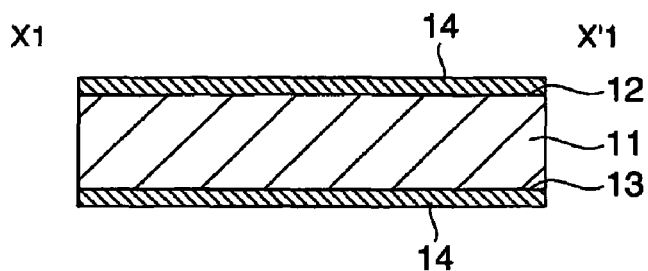
Figure 16A:
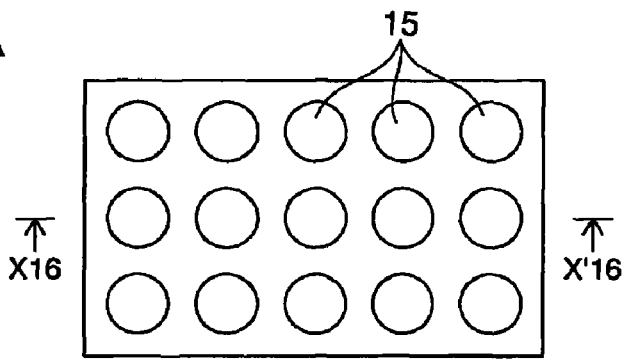
FIGS. 16A and 16B show the method for fabricating a lead frame in accordance with the embodiment.
Figure 16B:
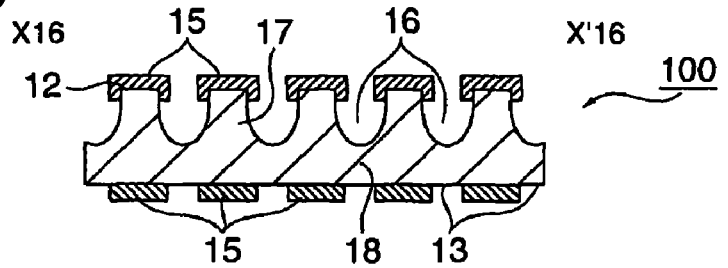

FIG. 1 (a)-FIG. 16 (b) are process figures showing a method for fabricating a lead frame 100 in accordance with a first embodiment of the invention. It is noted that (a) of each of the figures is a plan view, and (b) of each of the figures is a cross-sectional view.

First, as shown in FIGS. 1 (a) and (b), resist films 14 are coated on a first surface 12 included in a metal substrate 11 and a second surface 13 thereof opposite to the first surface 12. It is noted that as a base material of the lead frame 100 (i.e., the metal substrate 11), for example, copper (Cu) material is suitable. Further, in the case of Cu material, its thickness may be in a range, for example, between 0.10 mm and 0.30 mm.

Figure 2A:
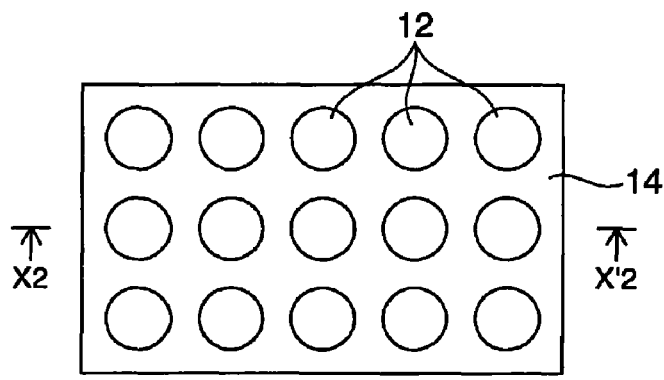
FIGS. 2A and 2B show the method for fabricating a lead frame in accordance with the embodiment.
Figure 2B:
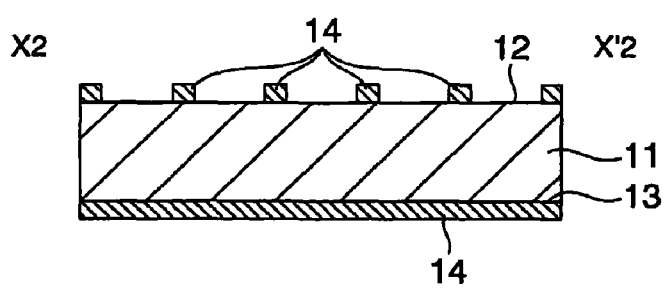

Next, as shown in FIGS. 2 (a) and (b), the resist film 14 coated on the first surface 12 is exposed to light, thereby developing (in other words, patterning the resist film 14), whereby a portion of the metal substrate 11 (in other words, a portion of the first surface 12) is exposed through the resist film 14.

Figure 3A:
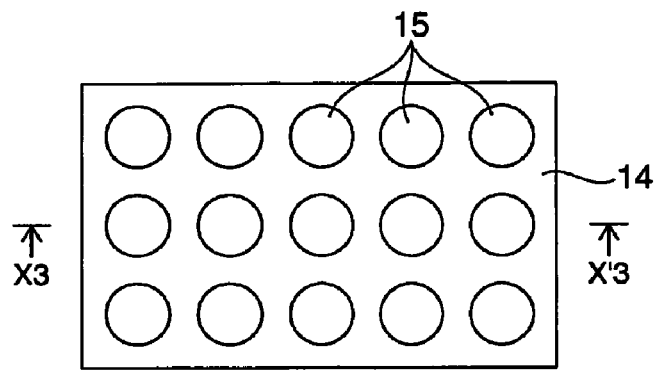
FIGS. 3A and 3B show the method for fabricating a lead frame in accordance with the embodiment.
Figure 3B:
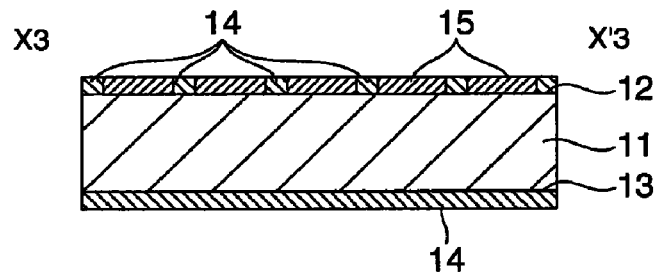
Figure 4A:
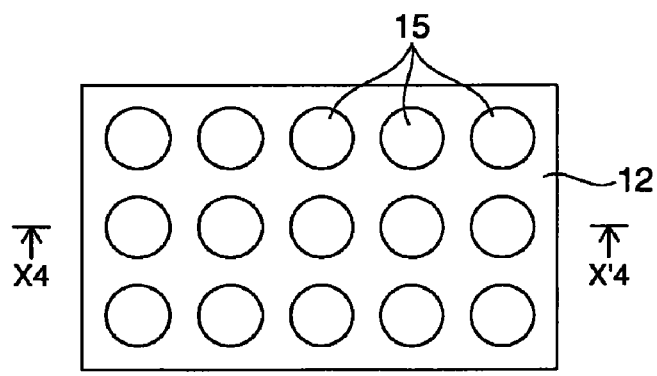
FIGS. 4A and 4B show the method for fabricating a lead frame in accordance with the embodiment.
Figure 4B:
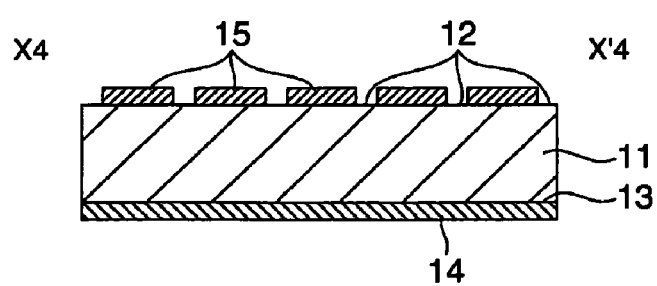

Then, as shown in FIGS. 3 (a) and 3 (b), a plated layer 15 is formed on the surface of the exposed metal substrate 11, and then, as shown in FIGS. 4 (a) and (b), the resist film 14 remaining on the first surface 12 is removed. In this instance, the plated layer 15 may be formed from a single layer of any one of silver (Ag), nickel (Ni), gold (Au) and palladium (Pd) layers, or a multilayer of suitable ones of the aforementioned layers being laminated. For example, the plated layer 15 may be formed from a plurality of layers composed of a nickel (Ni) layer, a palladium (Pd) layer and a gold (Au) layer. It is noted that, when the plated layer 15 is formed on the metal substrate 11, it may be formed, using electroplating. Also, when the plated layer 15 is formed, for example, a method by "electro deposition" may be used. It is noted that the "electro deposition" refers to formation of substance adhered to an electrode surface through electrolysis.

Figure 5A:
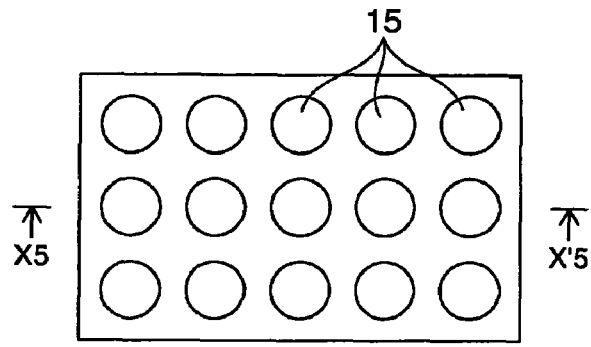
FIGS. 5A and 5B show the method for fabricating a lead frame in accordance with the embodiment.
Figure 5B:
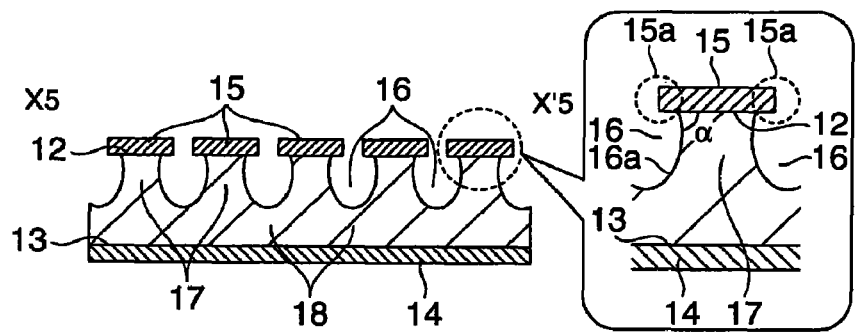

After the resist film 14 has been removed from the first surface 12, as shown in FIGS. 5 (a) and (b), the metal substrate 11 is etched by isotropic wet etching with the plated layer 15 formed on the first surface 12 as a mask. By this, a concave portion 16 is formed in the metal substrate 11 (in other words, a portion that is not etched forms a convex portion 17). Here, the etching is conducted in a manner to form a connection section 18 halfway through the depth direction of the metal substrate 11 (namely, half-etching). It is preferred that the metal substrate 11 may be etched to a depth of about ½ to ¹⁄₁₀ of the thickness of the metal substrate 11. For example, when the thickness of the Cu material is 0.10 mm, the etching may preferably be conducted to a depth of about 0.01 mm to 0.05 mm from the surface of the Cu material.

By the wet etching, as shown in an enlarged figure in FIG. 5 (b), the plated layer 15 is formed to include a portion 15a protruding from the first surface 12 included in the convex portion 17 (hereafter referred to as an outer peripheral portion 15a of the plated layer 15). This is because the metal substrate 11 immediately below the outer peripheral portion 15a of the plated layer 15 is carved, as the isotropic etching is conducted with the plated layer 15 used as a mask. In this instance, an angle of intersection α between the first surface 12 of the convex portion 17 and a side surface 16a of the convex portion 17 may be an acute angle, as viewed in a cross-sectional view.

Figure 6A:
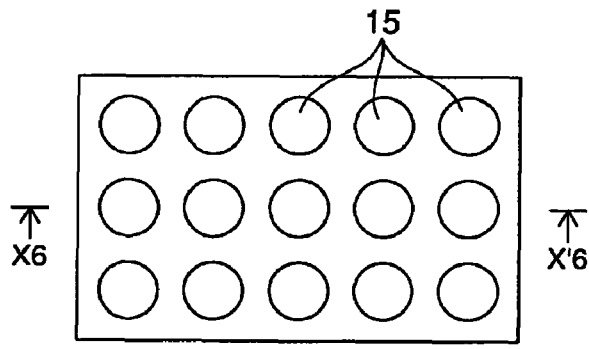
FIGS. 6A and 6B show the method for fabricating a lead frame in accordance with the embodiment.
Figure 6B:
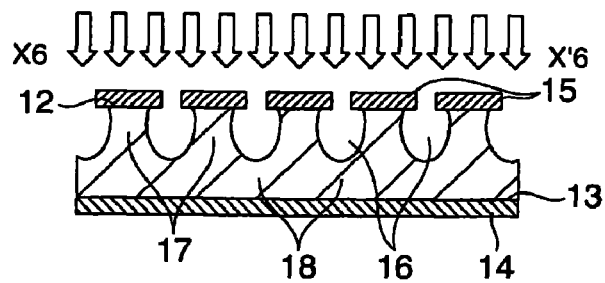
Figure 7A:
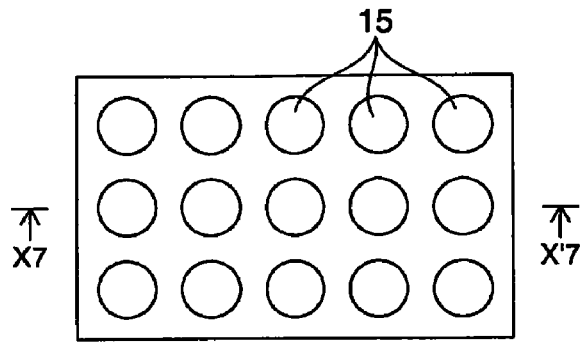
FIGS. 7A and 7B show the method for fabricating a lead frame in accordance with the embodiment.
Figure 7B:
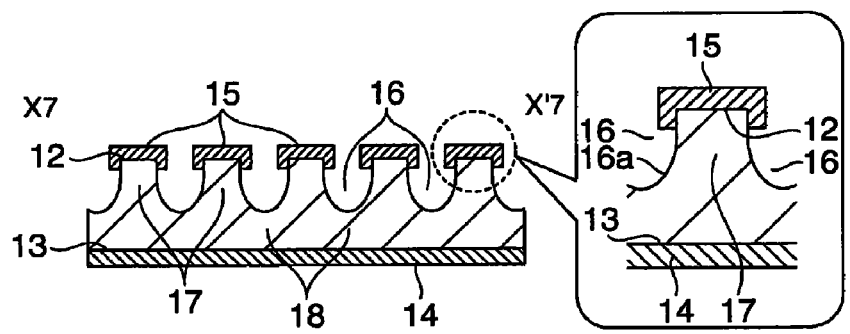

After the concave portion 16 has been formed (in other words, after the convex portion 17 has been formed) in the metal substrate 11 by wet etching, a physical force is applied to the outer peripheral portion 15a, thereby bending the outer peripheral portion 15a. It is noted that FIGS. 6 (a) and 6 (b) show the state before bending process, and FIGS. 7 (a) and (b) show the state after the process of bending the outer peripheral portions 15a.

As a method for the bending process, for example, by water jet, sand blast, honing or the like may be used. Here, the water jet is a fine water current obtained by pushing out pressurized water through a small aperture or the like of, for example, about 0.1 mm-1 mm in diameter. In the water jet, the substance that is pushed out is not limited to "water" but may be any liquid other than "water."

Moreover, without being limited to liquid, it may be a gas. When the substance that is pushed out is gas, a fine gas flow obtained by pushing out pressurized gas through a small aperture or the like of about 0.1 mm-1 mm in diameter may be used to perform the bending process. Also, by increasing the temperature of the substance to be pushed out, the bending process can be more effectively performed.

The sand blast is to blow abrasive material such as sands against a target surface, and may refer to blowing compressed air created by a compressor with abrasive material mixed therein. The honing mainly refers to precisely polishing an inner diameter of a processing target.

Further, in addition to the methods described above, for example, "heat" may be applied to the outer peripheral portions 15a to bend the outer peripheral portions 15a. Here, let us consider a case in which Cu material is selected as the base material of the lead frame 100, and Ag as the plated layer 15. Regarding the melting point of each of the metals, the melting point of Cu is 1357.6K, while the melting point of Ag is 1234.9K. Therefore, by adjusting the heating temperature, the outer peripheral portion 15a included in the plated layer 15 can be bent.

Figure 8A:
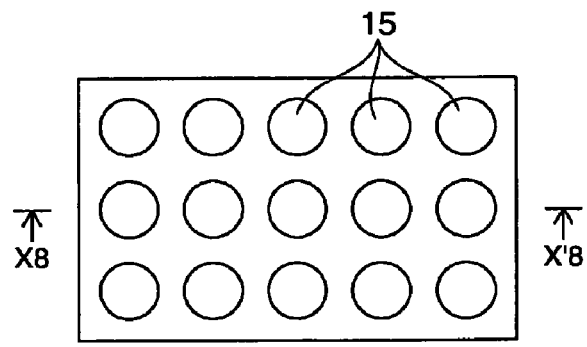
FIGS. 8A and 8B show the method for fabricating a lead frame in accordance with the embodiment.
Figure 8B:
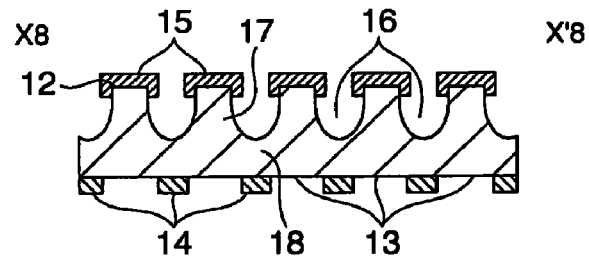

After the process of bending the plated layer 15, as shown in FIGS. 8 (a) and (b), the resist film 14 previously coated on the second surface 13 is patterned, thereby exposing a portion of the metal substrate 11 (in other words, a portion of the second surface 13) through the resist film 14.

Figure 9A:
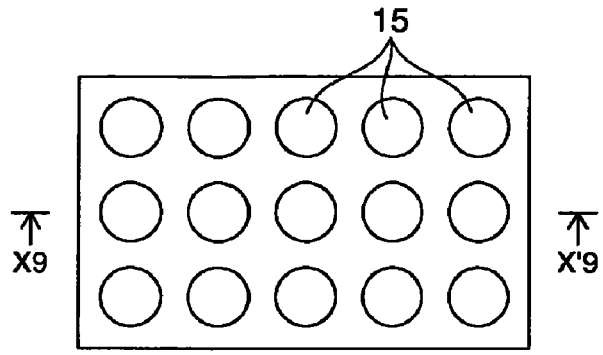
FIGS. 9A and 9B show the method for fabricating a lead frame in accordance with the embodiment.
Figure 9B:
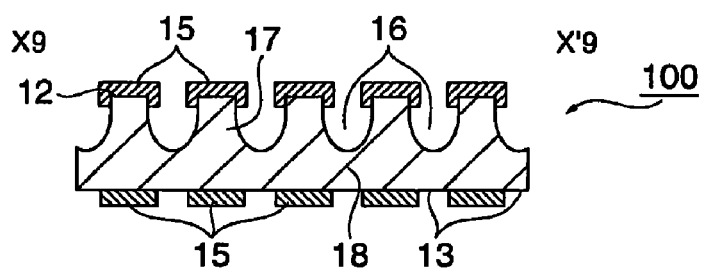

Lastly, as shown in FIGS. 9 (a) and (b), a plated layer 15 is formed on the exposed metal substrate 11, and then the resist film 14 remaining on the second surface 13 is removed. It is noted that the process of providing the plated layer 15 shown in FIGS. 9 (a) and (b) may be conducted in a similar manner as the process shown in, for example, FIG. 3 and FIG. 4.

Here, let us focus on the order in performing the process of bending the outer peripheral portion 15a relative to other processes. In the method of fabricating a lead frame described above, the process of bending the outer peripheral portion 15a is performed before the process of exposing a portion of the second surface 13 through the resist film 14 by patterning the resist film 14 previously coated on the second surface 13 (in other words, the process shown in FIG. 8). However, the process of bending the outer peripheral portion 15a is not limited to such an order, and can be executed if performed after the wet etching process. More specifically, for example, it can be performed after the process of forming the plated layer 15 on the second surface 13 (in other words, the process corresponding to FIG. 9).

Also, by performing the process of bending the outer peripheral portion 15a by using such a method as water jet, sand blast or the like, polluting substance remaining on the surface of the plated layer 15 can be removed, such that the surface quality of the plated layer 15 can also be improved. It is noted that the polluting substance may refer to substance or the like adhered to the surface of the plated layer 15, for example, in the process of forming the plated layer 15.

Prior to the process of bending the outer peripheral portion 15a, the side surface 16a of the convex portion 17 formed in the metal substrate 11 may be lightly etched (in other words, subject to soft-etching). By performing the soft-etching, fine roughness can be formed on the side surface 16a of the convex portion 17, whereby the surface area of the side surface 16a can be increased. Accordingly, when the outer peripheral portion 15a is bent, the contact surface between the outer peripheral portion 15a and the side surface 16a of the convex portion 17 can be increased. Accordingly, as the adherence between the outer peripheral portion 15a and the side surface 16a is increased, the plated layer 15 would become more difficult to fall off the convex portion 17. As a soft-etching agent to be used when performing the soft-etching, for example, diluted sulfuric acid may be used.

As for the number of the convex portions 17, a plurality of the convex portions 17 can be provided in the metal substrate 11.

Next, a second method for fabricating a lead frame will be described.

Figure 10A:
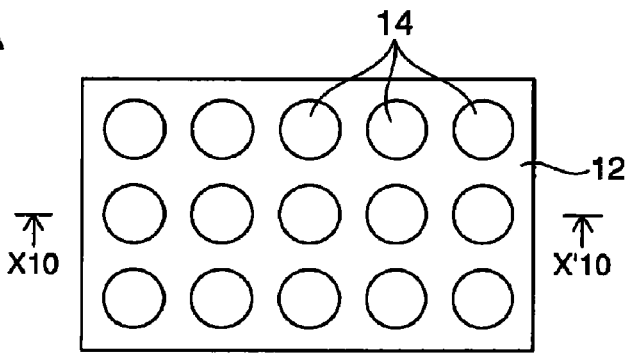
FIGS. 10A and 10B show the method for fabricating a lead frame in accordance with the embodiment.
Figure 10B:
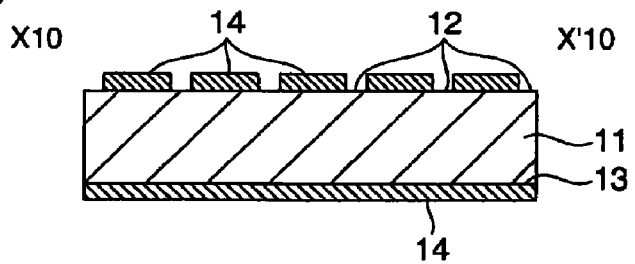

First, as shown in FIGS. 10 (a) and (b), first resist films 14 are coated on a first surface 12 included in a metal substrate 11 and a second surface 13 thereof opposite to the first surface 12. Next, the first resist film 14 coated on the first surface 12 is patterned, whereby a portion of the metal substrate 11 (in other words, a portion of the first surface 12) is exposed through the first resist film 14.

Figure 11A:
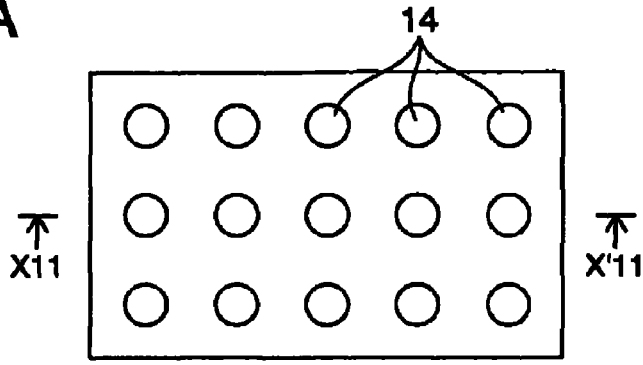
FIGS. 11A and 11B show the method for fabricating a lead frame in accordance with the embodiment.
Figure 11B:
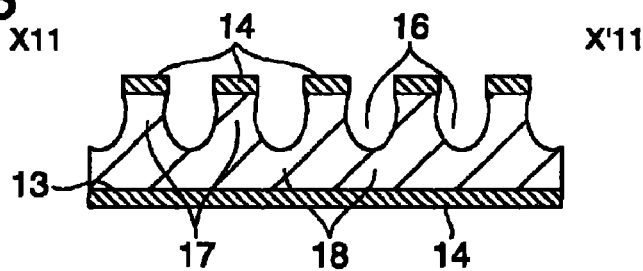

Next, as shown in FIGS. 11 (a) and (b), the metal substrate 11 is wet-etched by using the patterned first resist film 14 as a mask. By this, a concave portion 16 is formed on the side of the first surface 12 of the metal substrate 11. Here, half-etching is performed so as to provide a connection section 18 halfway through the depth direction of the metal substrate 11. Similar to the process in FIGS. 5 (a) and (b), in this half-etching, it is preferred that the metal substrate 11 may be etched to a depth of about ½ to ⅒ of the thickness of the metal substrate 11. For example, when the thickness of the Cu material is 0.10 mm, the etching may preferably be conducted to a depth of about 0.01 mm to 0.05 mm from the surface of the Cu material.

Figure 12A:
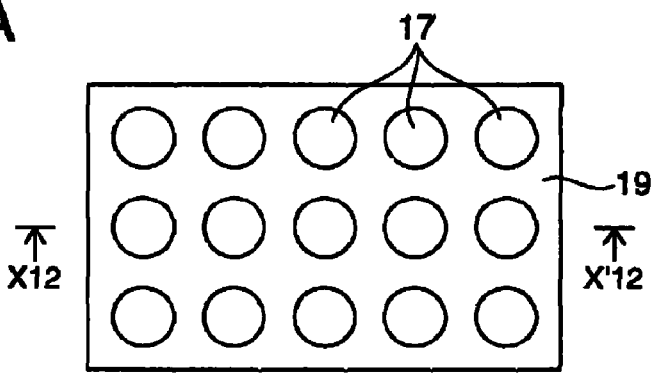
FIGS. 12A and 12B show the method for fabricating a lead frame in accordance with the embodiment.
Figure 12B:
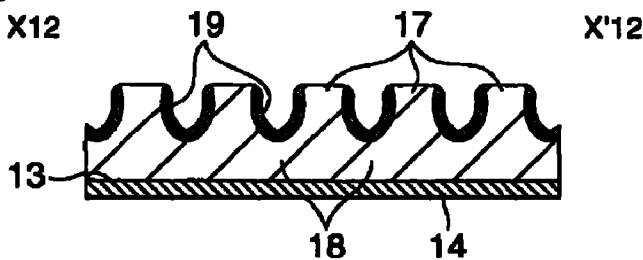

Then, as shown in FIGS. 12 (a) and 12 (b), the first resist film 14 remaining on the first surface 12 is removed, and then, a second resist film 19 is coated on the concave portion 16 formed by etching.

Figure 13A:
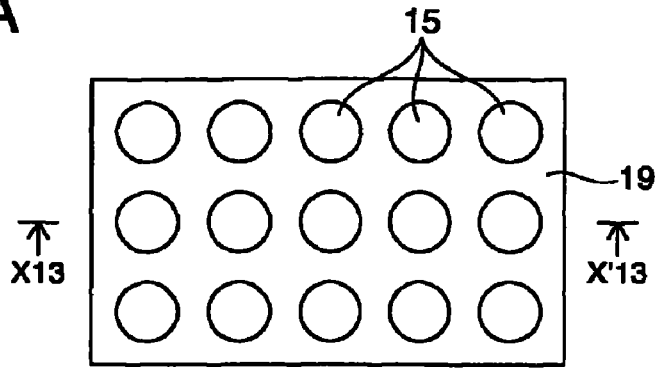
FIGS. 13A and 13B show the method for fabricating a lead frame in accordance with the embodiment.
Figure 13B:
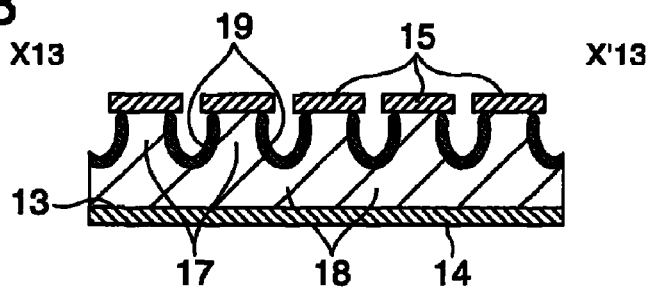

In the conventional art, it often becomes difficult to coat a resist film again on etched portions with high accuracy. However, according to the present invention, after coating the second resist film 19, a plated layer 15 is formed on the first surface 12 included in the convex portion 17, as shown in FIGS. 13 (a) and (b). It is noted that the plated layer 15 formed in this process has a greater area than the area of the first surface 12 included in the convex portion 17, and entirely covers the first surface 12 included in the convex portion 17. It is noted that, as for the material of the plated layer 15 and its forming method, the details described in conjunction with the FIGS. 3 (a) and (b) may be used.

Figure 14A:
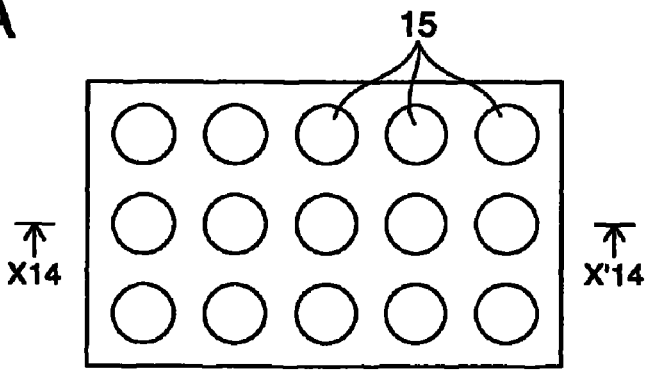
FIGS. 14A and 14B show the method for fabricating a lead frame in accordance with the embodiment.
Figure 14B:
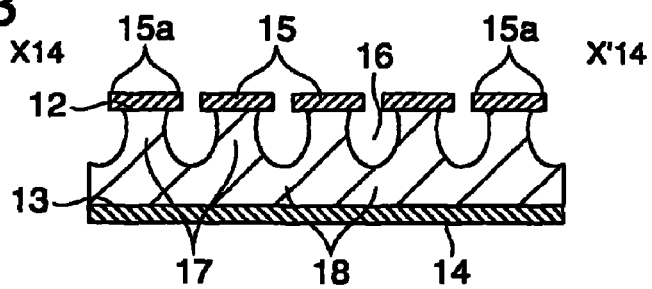
Figure 15A:
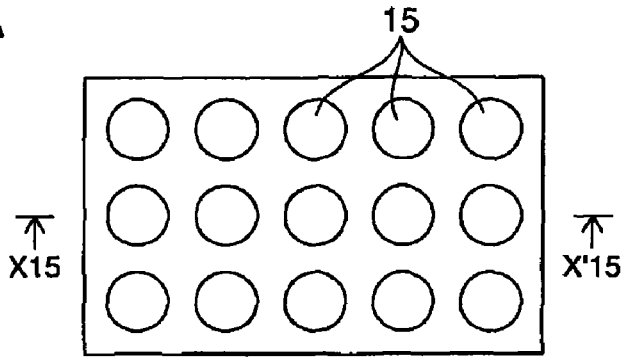
FIGS. 15A and 15B show the method for fabricating a lead frame in accordance with the embodiment.
Figure 15B:
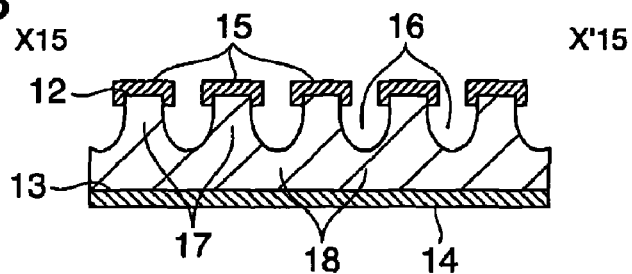

Thereafter, as shown in FIGS. 14 (a) and (b), the second resist film 19 is removed from the concave portion 16. Lastly, as shown in FIGS. 15 (a) and (b), the outer peripheral portion 15a included in the plated layer 15 is bent by applying a physical force thereto. For the bending process, the method described in conjunction with the processes in FIG. 6 (a) to FIG. 7 (b), such as, for example, a method of water jet, sand blast, honing, or the like may be used.

The succeeding process (i.e., the process of forming a plated layer 15 on the second surface 13) may be performed in a manner similar to the process shown in, for example, FIG. 8 and FIG. 9. By performing the process shown in FIG. 8 and FIG. 9 described above, the plated layer 15 can be formed on the second surface 13. Accordingly, the lead frame shown in FIGS. 16 (a) and (b) can be fabricated.

In the first method for fabricating a lead frame and the second method for fabricating a lead frame, at the time of performing the process of bending the outer peripheral portion 15a by using such a method as water jet, sand blast or the like, water, sands or the like may be jetted against the first surface 12 included in the convex portion 17 (or the top surface of the plated layer 15) in a direction tilted by a predetermined angle from a vertical direction, as shown in FIG.

Figure 17A:
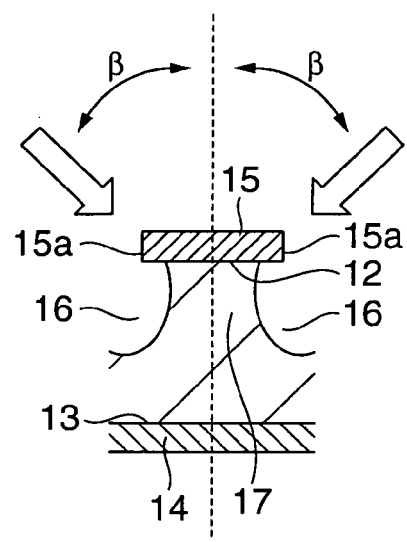
FIGS. 17A and 17B show the method for fabricating a lead frame in accordance with the embodiment.
Figure 17B:
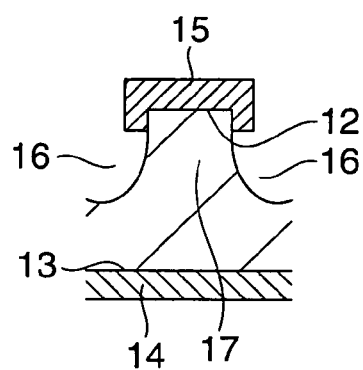

17 (*a*), whereby the outer peripheral portion 15*a* included in the plated layer 15 can be bent, as shown in FIG. 17 (*b*). The jetting direction is indicated by a broken line in FIG. 17 (*a*). Here, the angle β is, for example, an angle of 45 degrees.

It is noted that, in the second method for fabricating a lead frame, the process of bending the outer peripheral portion 15*a* is also possible if performed after the wet etching process, like the first method for fabricating a lead frame. In other words, for example, it can be performed after the plated layer 15 has been formed on the second surface 13.

Also, in the second method for fabricating a lead frame, by performing the process of bending the outer peripheral portions 15*a* by using such a method as water jet, sand blast or the like, like the first method for fabricating a lead frame, polluting substance remaining on the surface of the plated layer 15 can be removed. Accordingly, the surface quality of the plated layer 15 can also be improved.

It is noted that, in the first embodiment, the metal substrate 11 may be provided with the convex portions 17 and the plated layers 15 in plurality, for example. In other words, at the time of patterning the resist film 14 coated on the first surface 12, portions of the first surface 12 may be exposed at plural positions. Furthermore, metal layers may be formed in the plurality of exposed portions, respectively. By performing wet etching, using the plurality of metal layers thus formed as a mask, a plurality of convex portions 17 can be formed.

Moreover, the formed plural convex portions 17 may be formed in a manner to be arranged in longitudinal and lateral directions as viewed in a plan view.

Further, the formed plural convex portions 17 may be formed in a manner to align and separated at predetermined distances.

Furthermore, the formed plural convex portions 17 may be formed to have the same configuration and the same size.

More specifically, the lead frame 100 fabricated according to the first embodiment may be a lead frame that is equipped with, for example, as shown in FIGS. 5 (*a*) and (*b*), a convex portion 17 and a metal layer 15 having a metal portion that overlaps a first surface 12 included in the convex portion 17 and an outer peripheral portion 15*a* that extends from the metal portion and does not overlap the first surface 12, and may be a lead frame in which the outer peripheral portion 15*a* of the metal layer 15 is bent in a manner to overlap a side surface 16*a* included in the convex portion 17. Furthermore, an angle of intersection α between the first surface 12 of the convex portion 17 and the side surface 16*a* of the convex portion 17 may be an acute angle in a cross-sectional view. Also, a plurality of the convex portions 17 may be arranged in a longitudinal direction and a lateral direction in a plan view.

In this manner, according to the first embodiment of the invention, when wire-bonding is conducted in the process of fabricating a semiconductor device, the metal layer protruding from the first surface of the convex portion has already been bent, such that the risk of a portion of the metal layer being mechanically destroyed can be reduced. In other words, the lead frame 100 fabricated according to the method described above can prevent, with a high reliability, connection failures of the wiring members 22 and the like or bending and deforming of the plated layers 15, which are the problems of the conventional technology. Accordingly, the lead frames 100 that can improve their product yield and reliability can be stably provided.

(2) Second Embodiment

Figure 18A:
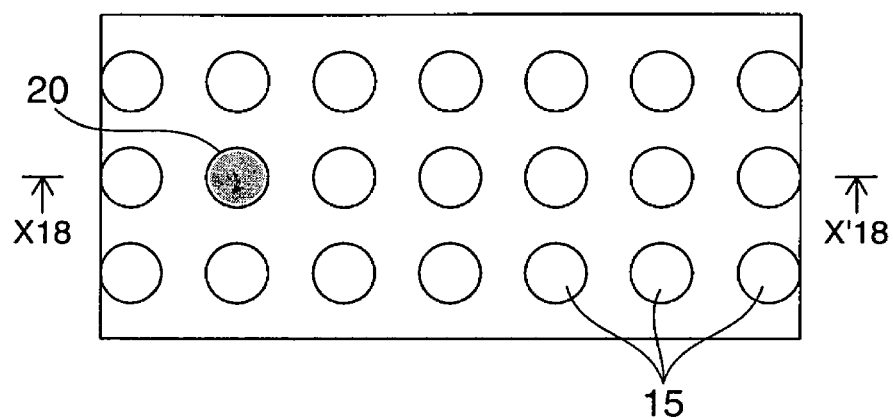
FIGS. 18A and 18B show a method for fabricating a semiconductor device in accordance with an embodiment.
Figure 18B:
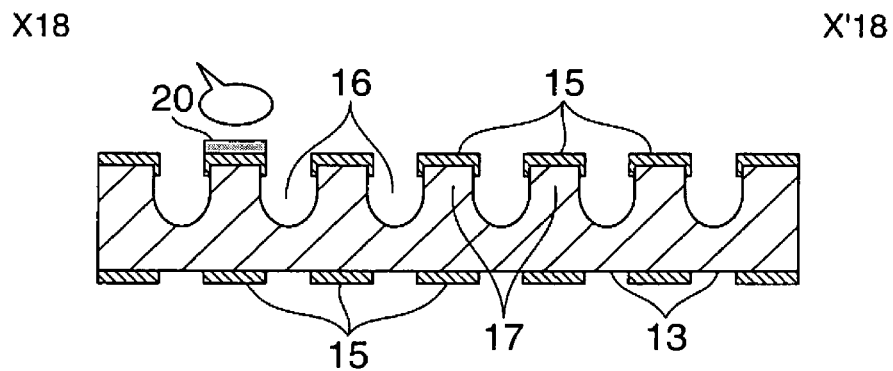
Figure 21A:
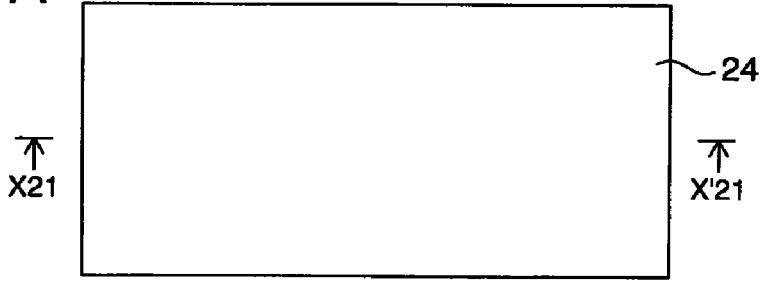
FIGS. 21A and 21B show the method for fabricating a semiconductor device in accordance with an embodiment.
Figure 21B:
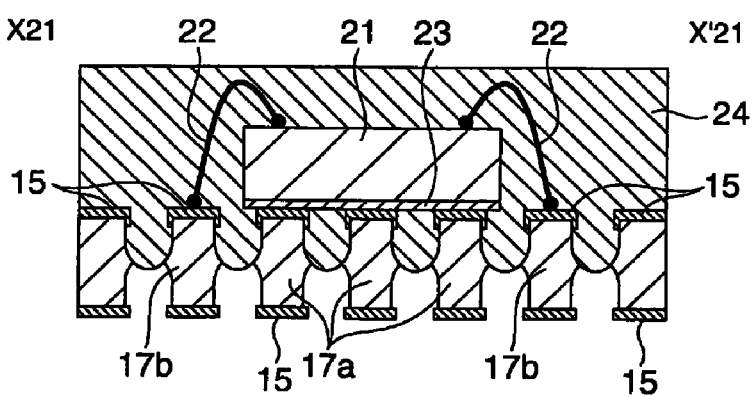

FIG. 18 (*a*)-FIG. 21 (*b*) are process figures showing a method for fabricating a semiconductor device in accordance with a second embodiment. First, as shown in FIGS. 18 (*a*) and (*b*), an identification mark 20 is provided on a plated layer 15 formed on a convex portion 17 included in a lead frame 100 described according to the first embodiment (in other words, a lead frame 100 fabricated by the first or second method for fabricating a lead frame). As for the location of the identification mark 20 to be provided, it may be arranged at a desired position according to the type of a product fabricated. It is noted that the identification mark 20 may be provided by an appropriate method, such as, for example, an ink jet method, a printing method, a dispersing method, a laser marking method or the like.

Figure 19A:
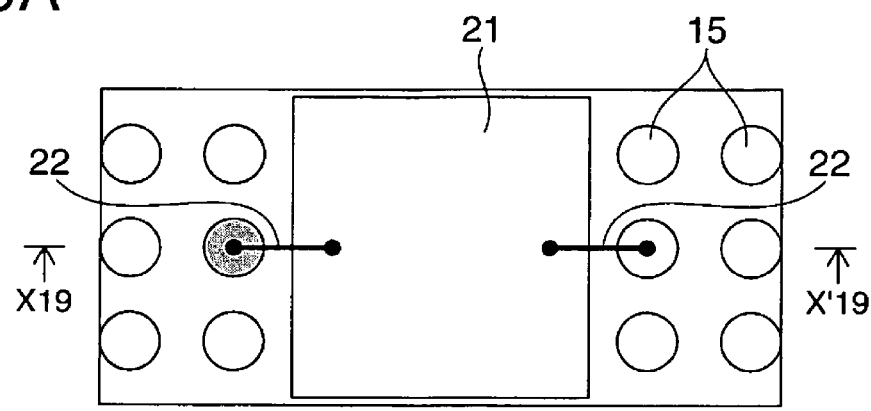
FIGS. 19A and 19B show the method for fabricating a semiconductor device in accordance with an embodiment.
Figure 19B:
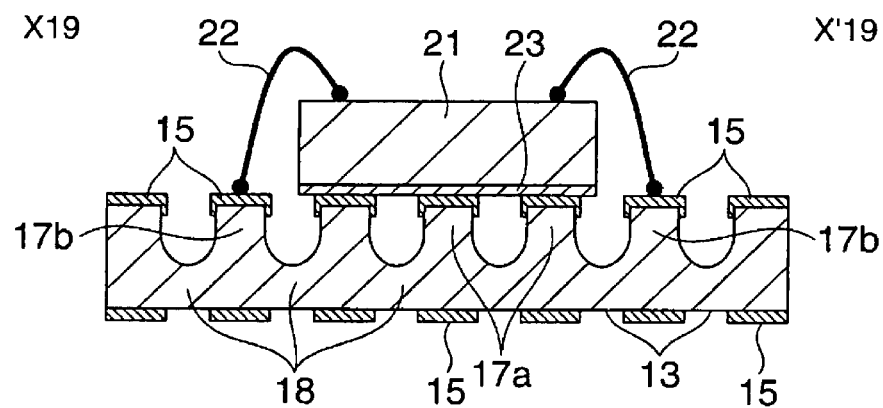

Next, as shown in FIGS. 19 (*a*) and (*b*), a circuit device such as an IC element 21 is mounted on a convex portion 17*a* with a plated layer 15 formed thereon (i.e., in a die attach process). In the die attach process, the IC element 21 contacts the plated layer 15 formed on the convex portion 17*a* through adhesive agent 23. As the adhesive agent 23 used in the die attach process, for example, a sheet material may be used. It is noted that, in accordance with the present embodiment, the convex portions 17 with a circuit device such as the IC element 21 or the like mounted thereon are referred to as "convex portions 17*a*" and the convex portions 17 without a circuit such as the IC element 21 or the like mounted thereon are referred to as "convex portions 17*b*."

After the die attach process, electrodes (i.e., pad terminals) of the IC element 21 are electrically connected to the convex portions 17*b* with the plated layer 15 formed thereon, using wiring members 22, such as, for example, gold wires (i.e., in a wire bonding process). As the material of the wiring members 22, aluminum or copper may also be used, in addition to gold.

Figure 20A:
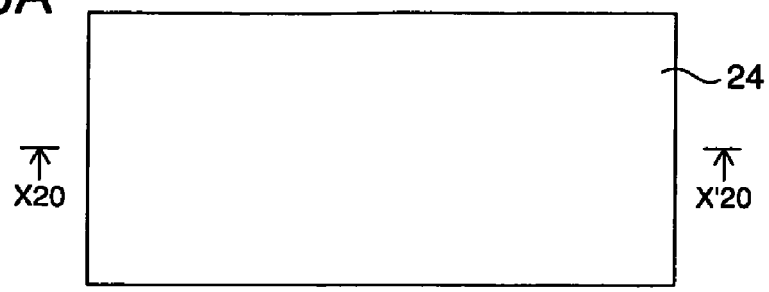
FIGS. 20A and 20B show the method for fabricating a semiconductor device in accordance with an embodiment.
Figure 20B:
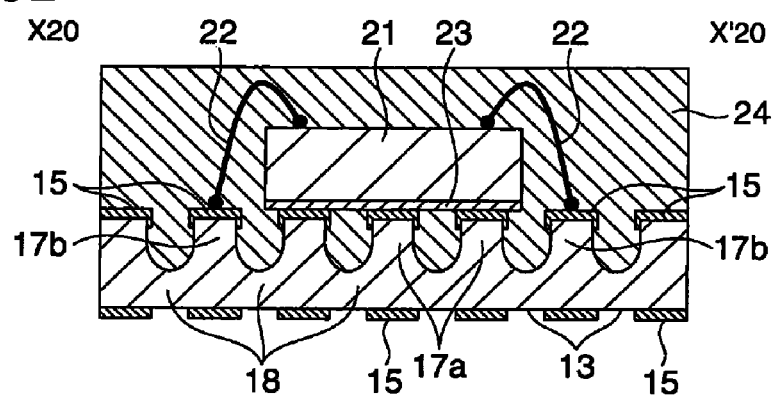

Then, as shown in FIGS. 20 (*a*) and (*b*), the IC element 21, the convex portions 17*a* and 17*b* formed with the plated layer 15, and the wiring members 22 such as gold wires are sealed with a resin 24 (i.e., in a sealing process). The resin 24 used in this sealing process may be, for example, a mold resin.

Lastly, as shown in FIGS. 21 (*a*) and (*b*), the connection sections 18 are etched from the side of the second surface 13 to expose the resin 24 (i.e., in a back surface penetration etching process). By this, as shown in FIG. 21 (*b*), the wire-bonded convex portions 17*b* are electrically separated from other convex portions that are not wire-bonded, such as, for example, the convex portions 17*a* with the IC element 21 mounted thereon.

Next, the resin 24 is diced into individual pieces. In this dicing process, the resin 24 is divided along dicing lines into individual resin packages, and marginal portions of the resin which do not become the products are cut and removed. Also, the resin 24 may be cut by, for example, using the plated layers 15 exposed on the side of the second surface 13 as marks. By this, the semiconductor device 200 is completed.

In other words, the semiconductor device 200 includes the convex portions 17 provided on the lead frame fabricated according to, for example, the first embodiment, wherein the convex portions 17 include first convex portions 17*a* and second convex portions 17*b*, the IC element 21 fixed to the first surface 12 included in the first convex portions 17*a* through the metal layer 15, the gold wires 22 that electrically connect the metal layers 15 formed on the first surface 12 included in the second convex portions 17*b* with the pad terminals of the IC element 21, and the resin that seals the IC element 21, the gold wires 22, and portions on the side of the first surface included in the plural convex portions 17.

In this manner, according to the second embodiment of the invention, the lead frame fabricated according to the method for fabricating a lead frame in accordance with the first embodiment can be used, such that it is possible to reduce the risk of a portion of the metal layer being mechanically destroyed at the time of performing wire-bonding. Accordingly, the semiconductor devices 200 that can improve their product yield and reliability can be stably provided.

Figure 22:
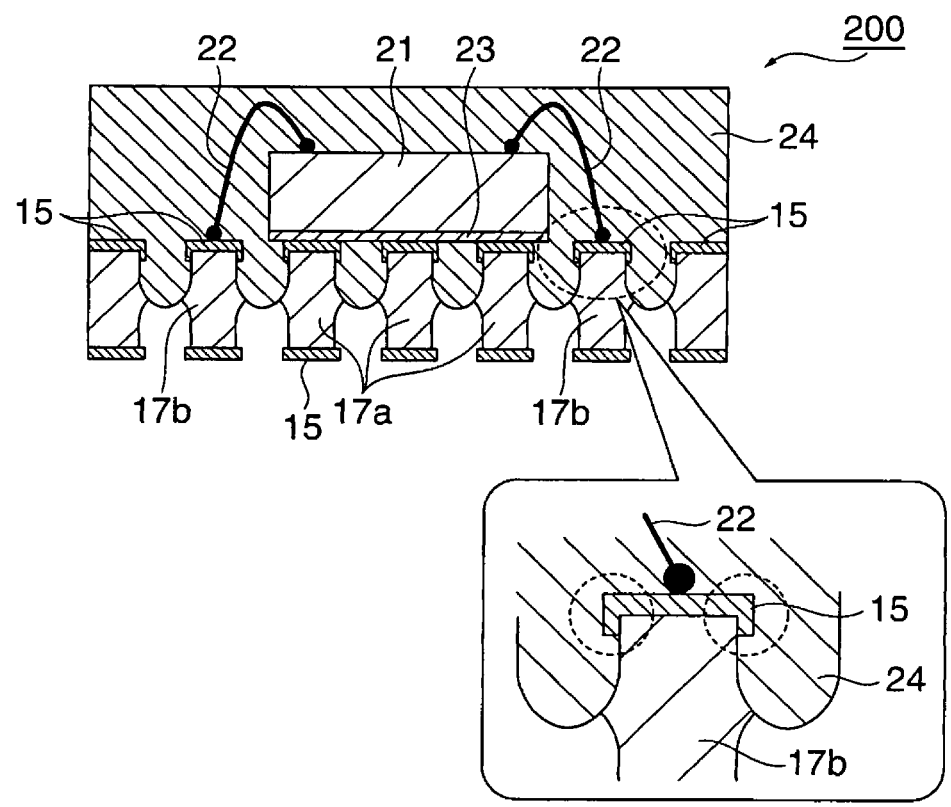
FIG. 22 shows a cross-sectional view showing a semiconductor device in accordance with an embodiment.
Figure 23A:
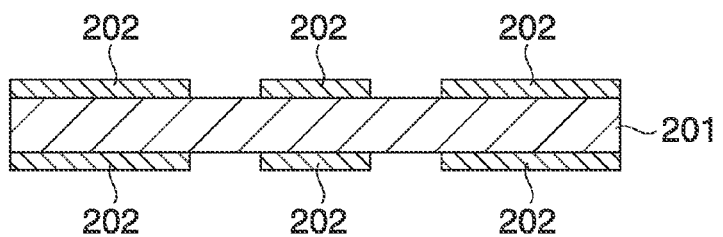
FIGS. 23A-23E show a conventional process for fabricating a semiconductor device.
Figure 23B:
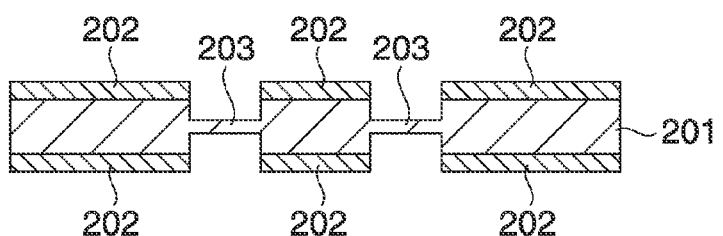
Figure 23C:
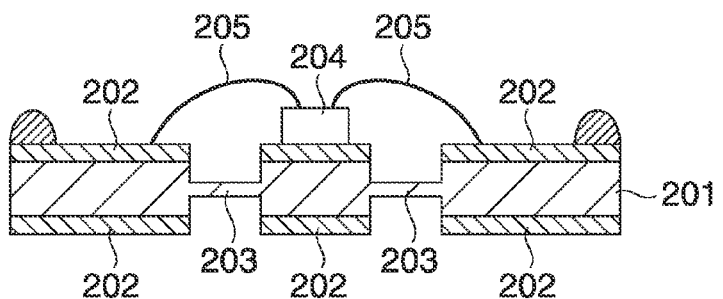
Figure 23D:
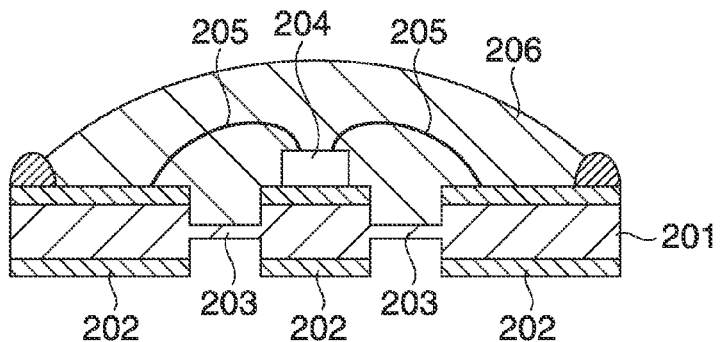
Figure 23E:
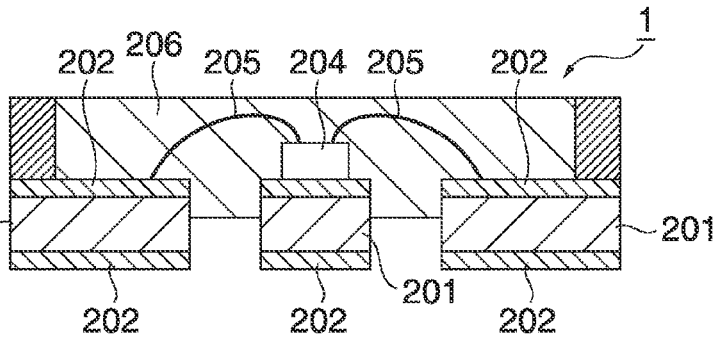
Figure 24A:
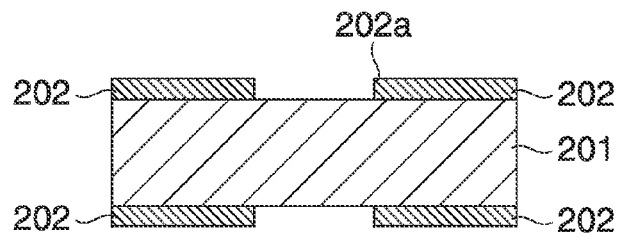
FIGS. 24A-24D show cross-sectional views showing a problem.
Figure 24B:
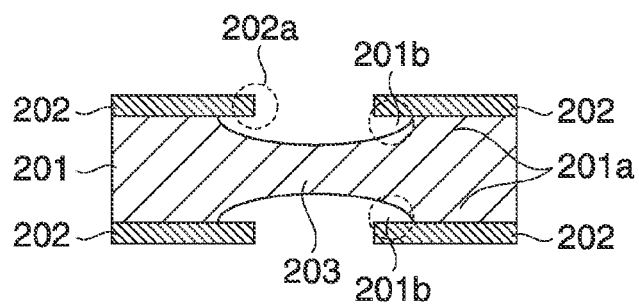
Figure 24C:
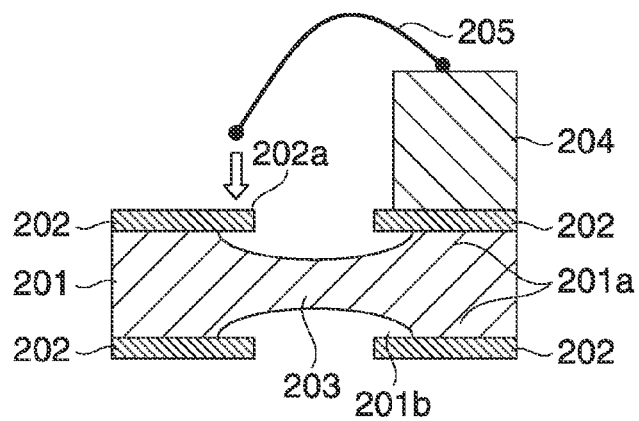
Figure 24D:
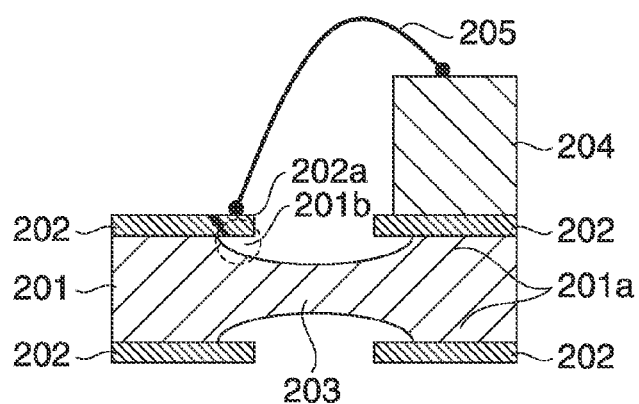
Figure 25A:
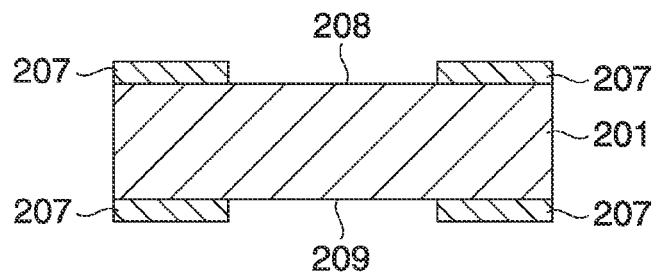
FIGS. 25A-25E show cross-sectional views showing a problem.
Figure 25B:
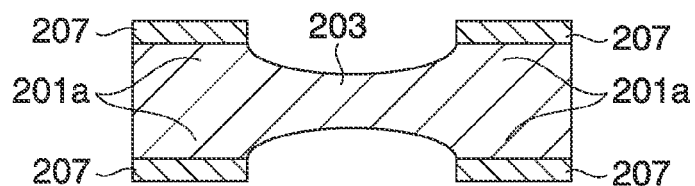
Figure 25C:
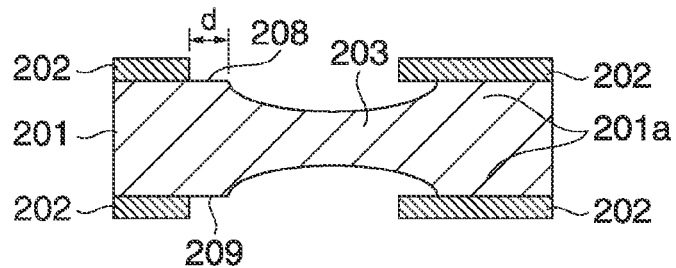
Figure 25D:
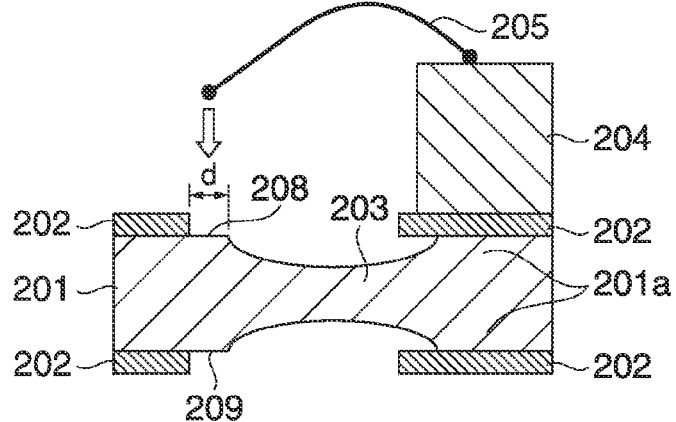
Figure 25E:
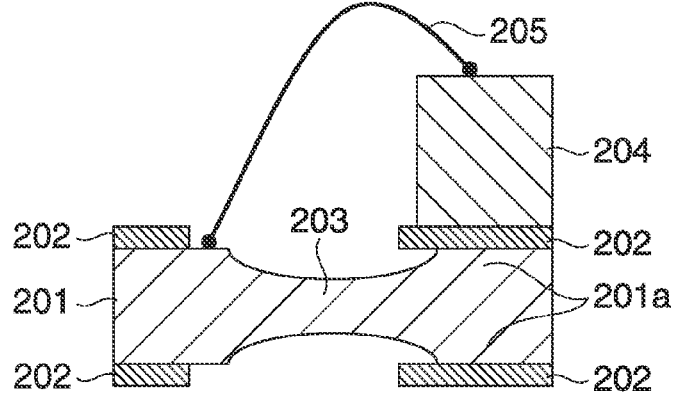

Furthermore, as shown in an enlarged view included in FIG. 22, sealing with the resin 24 is conducted in a state in which the outer peripheral portions 15*a* are bent, such that the bent outer peripheral portion 15*a* (i.e., portion indicated by broken lines in the figure) plays a role as an anchor, which can prevent the IC element 21 and the like from falling off. By this, the semiconductor device 200 with an improved mechanical strength can be provided.

It is noted that the "outer peripheral portion 15*a*" in the first and second embodiments corresponds to a "second portion" of the present invention, and portions included in the plated layer 15 at locations other than the "outer peripheral portion 15*a*" correspond to the "first portion" of the present invention. Further, the side surface 16*a* of the convex portion 17 in the first and second embodiments corresponds to the "second surface" of the present invention.

The invention claimed is:

1. A method for fabricating a lead frame, the method comprising:
    forming a substrate equipped with a convex portion, and a metal layer having a first portion that overlaps a first surface of the convex portion and a second portion that extends from the first portion and does not overlap the first surface; and
    bending the metal layer such that the second portion of the metal layer overlaps a second surface of the convex portion that intersects the first surface.

2. A method for fabricating a lead frame according to claim 1, wherein the forming of the substrate includes forming the metal layer on a surface of a metal substrate, and forming the convex portion by wet etching the metal substrate using the metal layer as a mask.

3. A method for fabricating a lead frame according to claim 1, wherein the forming of the substrate includes:
    coating a first resist film on a surface of a metal substrate;
    wet-etching the metal substrate with the first resist film as a mask;
    removing the first resist film after the wet-etching;
    coating a second resist film in a concave portion formed by the etching, after the removing of the first resist film;
    forming the metal layer on the metal substrate exposed through the second resist film, after the coating of the second resist film; and
    removing the second resist film, after the forming of the metal layer.

4. A method for fabricating a lead frame recited in claim 1, wherein the forming of the substrate includes forming the substrate to have a plurality of the convex portions, wherein the plurality of the convex portions have the same shape and the same size.

5. A lead frame comprising:
    a substrate equipped with a convex portion, and a metal layer having a first portion that overlaps a first surface of the convex portion and a second portion that extends from the first portion and does not overlap the first surface, and wherein the second portion of the metal layer being bent in a manner to overlap a second surface of the convex portion that intersects the first surface.

6. A lead frame according to claim 5, wherein an angle of intersection between the first surface and the second surface is an acute angle in a cross-sectional view.

7. A semiconductor device wherein comprising:
    a substrate equipped with a convex portion, and a metal layer having a first portion that overlaps a first surface of the convex portion and a second portion that extends from the first portion and does not overlap the first surface;
    an IC element fixed to the substrate and having an electrode;
    a conductive member that connects the metal layer to the electrode of the IC element; and
    a resin that seals the IC element and the conductive member.

* * * * *